US008559192B2

(12) United States Patent
Murakata et al.

(10) Patent No.: US 8,559,192 B2
(45) Date of Patent: Oct. 15, 2013

(54) DISPLAY DEVICE AND ELECTRONIC EQUIPMENT

(75) Inventors: Masato Murakata, Hyogo (JP); Kazuhiro Oota, Hyogo (JP); Toshiharu Ishimura, Osaka (JP)

(73) Assignee: Panasonic Corporation, Osaka (JP)

( * ) Notice: Subject to any disclaimer, the term of this patent is extended or adjusted under 35 U.S.C. 154(b) by 187 days.

(21) Appl. No.: 13/044,005

(22) Filed: Mar. 9, 2011

(65) Prior Publication Data

US 2011/0222220 A1 Sep. 15, 2011

(30) Foreign Application Priority Data

Mar. 10, 2010 (JP) .................................. 2010-053318

(51) Int. Cl.
*H05K 9/00* (2006.01)
*G02F 1/1333* (2006.01)
(52) U.S. Cl.
USPC ........... 361/816; 361/818; 361/800; 345/905; 349/58
(58) Field of Classification Search
USPC .............. 345/1.1, 1.3, 204–206, 905; 349/56, 349/58–60, 161
See application file for complete search history.

(56) References Cited

U.S. PATENT DOCUMENTS

| 5,101,139 A | 3/1992 | Lechter |
| 5,953,206 A | 9/1999 | Jondrow |
| 6,118,509 A | 9/2000 | Miyake |
| 6,362,860 B1 | 3/2002 | Sagawa |
| 6,490,016 B1 | 12/2002 | Koura |
| 6,621,003 B2 | 9/2003 | Yoshida et al. |
| 7,030,546 B2 | 4/2006 | Han et al. |
| 7,211,741 B2 | 5/2007 | Kim et al. |
| 2004/0114372 A1 | 6/2004 | Han et al. |
| 2006/0158837 A1 | 7/2006 | Kim et al. |
| 2008/0013011 A1 | 1/2008 | Hiratsuka et al. |
| 2008/0058036 A1* | 3/2008 | Nibe ........................... 455/575.1 |
| 2008/0089018 A1* | 4/2008 | Kim et al. ...................... 361/681 |
| 2009/0067112 A1 | 3/2009 | Takabayashi |
| 2009/0244437 A1* | 10/2009 | Yamaguchi et al. ............. 349/60 |
| 2011/0006650 A1* | 1/2011 | Hua .............................. 312/237 |

FOREIGN PATENT DOCUMENTS

| JP | 04-371921 | 12/1992 |
| JP | 06-148670 | 5/1994 |
| JP | 2003-216056 | 7/2003 |
| JP | 2004-191996 | 7/2004 |
| JP | 2004361615 A | * 12/2004 |

(Continued)

*Primary Examiner* — Zachary M Pape
*Assistant Examiner* — Douglas Burtner
(74) *Attorney, Agent, or Firm* — Hamre, Schumann, Mueller & Larson, P.C.

(57) ABSTRACT

The display device includes: a panel module 4 that includes a display panel 16 and a driving circuit for driving the display panel 16; a metallic front housing 11 that partially covers the panel module 4 from a display surface side of the display panel 16; and a metallic back housing 12 that covers the panel module 4 from a back surface side of the display panel 16. A conductive cloth 24 is disposed between the panel module 4, and the front housing 11 and the back housing 12, the conductive cloth 24 continuously covering a circumferential edge portion of the panel module 4 on the display surface side, a side surface portion of the panel module 4 and a circumferential edge portion of the panel module 4 on the back surface side and being connected electrically to the front housing 11 and the back housing 12.

8 Claims, 2 Drawing Sheets

(56) References Cited

FOREIGN PATENT DOCUMENTS

| | | |
|---|---|---|
| JP | 2006-005836 | 1/2006 |
| JP | 2006-053241 | 2/2006 |
| JP | 2006-203158 | 8/2006 |
| JP | 2008-064829 | 3/2008 |
| JP | 2009-086631 | 4/2009 |
| KR | 10-2004-0009621 | 1/2004 |

* cited by examiner

DISPLAY DEVICE AND ELECTRONIC EQUIPMENT

BACKGROUND OF THE INVENTION

1. Field of the Invention

The present invention relates to a display device including a panel module in which a display panel and a driving circuit for the display panel are integrated, and in particular, relates to a display device capable of preventing undesired electromagnetic radiation from a panel module and electronic equipment in which the display device is used as a display portion.

2. Description of Related Art

Recently, as plate-type display elements that display information such as images and characters, various kinds of display panels including a liquid crystal panel, a plasma display panel (PDP), an organic or inorganic electro luminescence (EL) panel and a field emission display (FED) panel have been developed.

Generally, these various display panels are treated as panel modules in which a display panel for displaying information and a driving circuit for driving the display panel are integrated, and display predetermined information when a suitable power and a driving signal are input to the panel module. In the case where the display panel is a liquid crystal panel, a backlight that outputs illumination light required for displaying information on the non-light-emitting liquid crystal panel is incorporated on a back surface side of the liquid crystal panel as a part of the panel module. Then, the display device using the display panel is assembled so that the panel module is sandwiched by a front housing located on an image display surface side of the display panel and a back housing located on a back surface side thereof.

Besides the use as stationary-type displays such as a television receiver and a monitor of a personal computer, the display devices using these display panels often are used as displays of portable equipment such as a notebook computer, a personal digital assistant (PDA), a portable DVD player, an electronic dictionary, a game machine and a mobile telephone, by taking advantage of thinness and lightness.

However, in the display device using the display panel, there is a problem that undesired electromagnetic radiation occurring from the display panel itself or driving circuit of the display panel affects a human body or other electronic equipment near the periphery of the display device. For preventing such undesired electromagnetic radiation from the display device using the display panel, a method has been known in which, in order to form a conductive loop, a filter glass is disposed in front of the display panel, and the filter glass and a housing containing a panel module are connected electrically using a gasket (see JP 2006-053241 A).

The technology described in the above Patent Document has been developed for use in comparatively large, stationary-type display devices such as a television set. However, since the filter glass directly leading to an increase in weight of the display device is used, it is difficult to apply the above conventional technology to the display device that is used as the display portion of the portable equipment, for which compactness and lightness as a whole are strongly demanded. Further, in the portable equipment, for making the equipment more compact as a whole, circuit elements having other functions often are disposed on the periphery of the panel module (display portion). Therefore, it is important effectively to prevent the undesired electromagnetic radiation toward sides of the panel module for not affecting other functional elements.

The invention disclosed in the present application solves the above-mentioned conventional problem, and its object is to obtain a display device in which measures are taken for preventing a situation that undesired electromagnetic radiation from a display panel and a driving circuit for driving the display panel do not affect an electric circuit disposed on the periphery of the display device, and electronic equipment including such a display device as a display portion.

SUMMARY OF THE INVENTION

In order to solve the above-mentioned problem, a display device disclosed in the present application includes: a panel module that includes a display panel and a driving circuit for driving the display panel; a metallic front housing that partially covers the panel module from a display surface side of the display panel; and a metallic back housing that covers the panel module from a back surface side of the display panel. A conductive cloth is disposed between the panel module, and the front housing and the back housing, the conductive cloth continuously covering a circumferential edge portion of the panel module on the display surface side, a side surface portion of the panel module and a circumferential edge portion of the panel module on the back surface side and being connected electrically to the front housing and the back housing.

Further, electronic equipment disclosed in the present application includes the display device disclosed in the present application as a display portion.

DETAILED DESCRIPTION OF THE INVENTION

Figure 1:
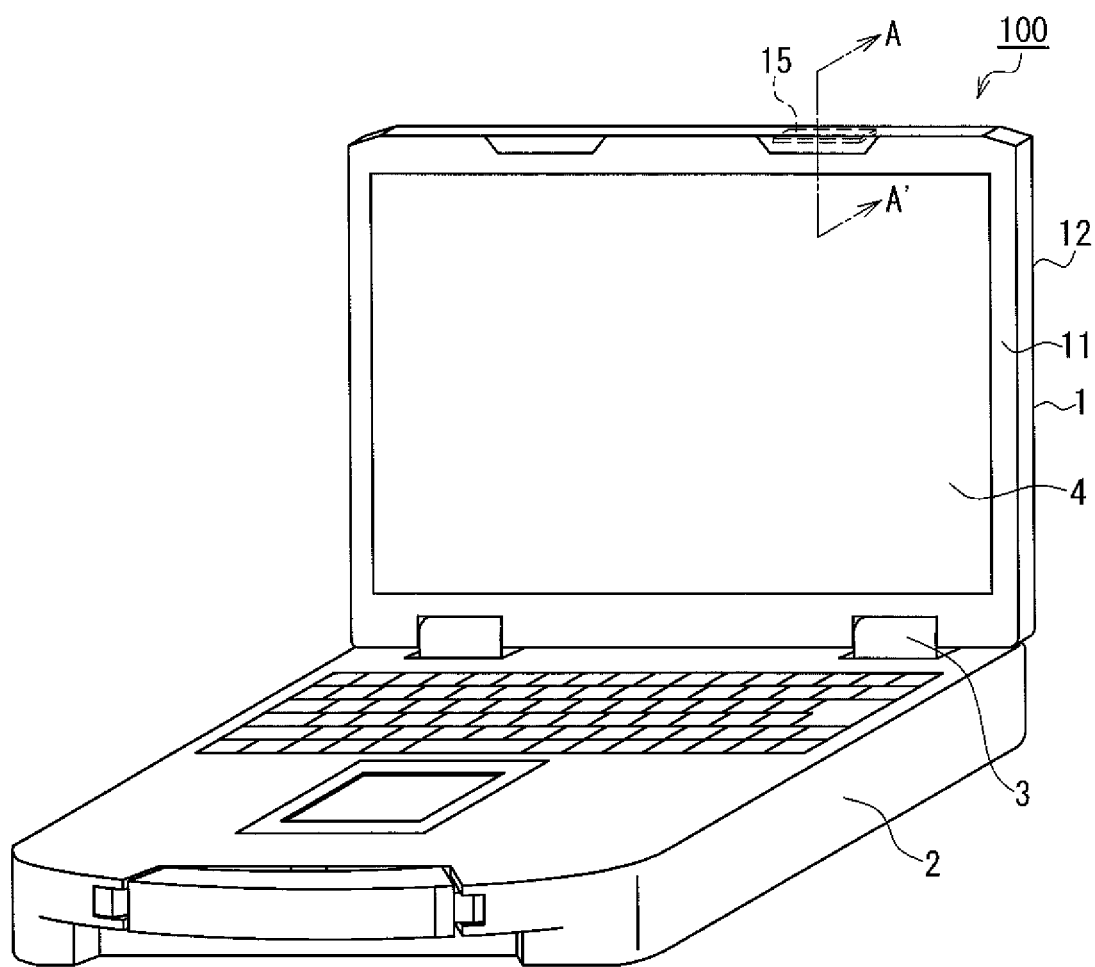
FIG. 1 is a perspective view showing an overall configuration of a notebook computer according to Embodiment.

A display device disclosed in the present application includes: a panel module that includes a display panel and a driving circuit for driving the display panel; a metallic front housing that partially covers the panel module from a display surface side of the display panel; and a metallic back housing that covers the panel module from a back surface side of the display panel. A conductive cloth is disposed between the panel module, and the front housing and the back housing, the conductive cloth continuously covering a circumferential edge portion of the panel module on the display surface side, a side surface portion of the panel module and a circumferential edge portion of the panel module on the back surface side and being connected electrically to the front housing and the back housing.

With this configuration, the conductive cloth covers a joint portion between the metallic front housing and the back housing without a space, and the front housing and the back housing can have the same electric potential. Thus, the leakage of undesired electromagnetic radiation from the side surface of the panel module can be prevented effectively.

In the above-described display device, preferably, a metallic chassis is provided on the back surface side of the panel module, and the conductive cloth is connected electrically to the metallic chassis. With this configuration, the metallic chassis can have the same electric potential as the front housing and the back housing, whereby undesired electromagnetic radiation from the panel module can be shielded more effectively.

Further, preferably, an antenna module is disposed so as to be spaced from a side edge portion of a joint portion where the front housing and the back housing are joined with each other, and the conductive cloth is disposed between the antenna module and the panel module. With this configuration, the influence of undesired electromagnetic radiation from the panel module on the antenna module can be prevented effectively.

Further, preferably, the conductive cloth is made of a cushioning member having elasticity in its thickness direction, or elastic members are disposed between the conductive cloth and the circumferential edge portion of the panel module on the display surface side, the conductive cloth and the side surface portion of the panel module, and the conductive cloth and the circumferential edge portion of the panel module on the back surface side, respectively. With this configuration, the panel module is sandwiched by the front housing and the back housing firmly while the undesired electromagnetic radiation from the panel module can be prevented.

Further, electronic equipment includes the display device disclosed in the present application as a display portion.

With this configuration, it is possible to prevent the undesired electromagnetic radiation from the panel module of the display portion from affecting an electric circuit that is another functional element in the electronic equipment, whereby highly reliable electronic equipment providing stable operations can be obtained.

Hereinafter, as an embodiment of a display device and electronic equipment disclosed in the present application, a notebook computer (electronic equipment) that uses a display device as a display portion in which a transmission-type liquid crystal panel is provided as a display panel will be described FIG. 1 is a perspective view showing the external appearance of a notebook computer according to the present embodiment.

As shown in FIG. 1, a notebook computer 100 of the present embodiment is composed of a display portion 1 that is a display device and a main body portion 2. The display portion 1 is attached rotatably to the main body portion 2 by hinge mechanisms 3, and serves as a cover section of the main body portion 2 when the notebook computer 100 is not in use.

The display portion 1 includes a front housing 11 arranged in such a manner as to partially cover a display surface side of a panel module 4 and a back housing 12 arranged in such a manner as to cover a back surface side of the panel module 4. Note here that only an image display surface of a liquid crystal panel of the panel module 4 is seen in FIG. 1.

Further, as shown in FIG. 1, when the notebook computer 100 is in use, that is, the display portion 1 is in an open state, an antenna module 15 for a wireless LAN communication is provided at an upper end of the display portion 1.

On a surface of the main body portion 2, as a general configuration of a notebook computer, a keyboard, a touch pad, a cover section of a disk drive device are provided. Further, inside the main body portion 2, a circuit configuration including a CPU and a memory, rechargeable batteries, various kinds of driving devices and the like are stored. Since a conventionally known configuration of the notebook computer can be applied directly as the configuration of the main body portion 2, the detailed description thereof is omitted.

Figure 2:
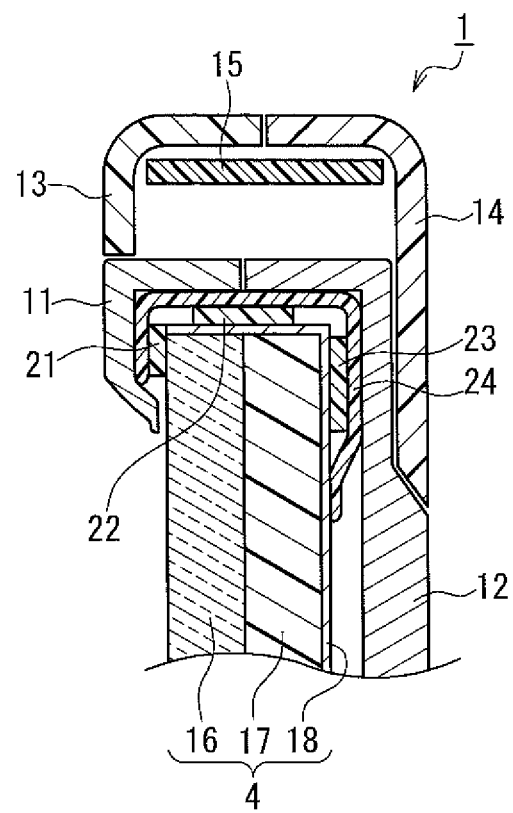
FIG. 2 is a partial enlarged cross-sectional view showing a configuration of a display portion of the notebook computer according to Embodiment near the position of an antenna module.

FIG. 2 is a partial enlarged cross-sectional view showing the configuration of the display portion 1 of the notebook computer 100 according to the present embodiment near a part where the antenna module 15 is arranged. FIG. 2 shows a cross-sectional configuration taken along a line A-A' in FIG. 1.

As shown in FIG. 2, the front housing 11 located on the display surface side of the panel module 4 and the back housing 12 located on the back surface side of the panel module 4 sandwich the panel module 4 that includes a liquid crystal panel 16 as a display panel, a backlight 17 as a light source for displaying images on the liquid crystal panel 16, and a module structure 18 for integrating the liquid crystal panel 16 and the backlight 17, thereby forming the display portion 1 of the notebook computer 100 of the present embodiment.

A conductive cloth 24 is disposed between the panel module 4, and the front housing 11 and the back housing 12 via elastic members 21, 22 and 23. In FIG. 2, on an upper side of a joint portion where an end of the front housing 11 and an end of the back housing 12 are butt-joined together, the antenna module 15 is disposed so as to be spaced at a predetermined distance from side edge portions of the front housing 11 and the back housing 12 and covered by a front cover 13 and a back cover 14 made of resin.

Note here that in the notebook computer 100 of the present embodiment, since the front housing 11 and the back housing 12 are light and robust, they are formed of a magnesium alloy as one example of the metal member constituting the housings. Further, various kinds of metal materials such as aluminum and an aluminum alloy can be used as other materials constituting the metallic housings.

The front housing 11 includes a window portion at its center so as to correspond to a display area of the liquid crystal panel 16, and therefore has a voided square shape as a whole, thereby functioning as an escutcheon for covering over an inactive area at a circumferential edge portion of the display area of the liquid crystal panel 16.

The panel module 4 is constituted from the metallic module structure 18 that contains the transmission-type liquid crystal panel 16 as a display panel and the backlight 17 outputting illumination light for displaying information on the liquid crystal panel 16. Further, on the back surface side of the backlight 17, a circuit board (not shown) is arranged on which a driving circuit for driving the liquid crystal panel 16 and the backlight 17 are mounted. The circuit board is connected by a flexible printed board to an electrode portion that is formed at an end portion of a panel of the liquid crystal panel 16.

In the notebook computer 100 according to the present embodiment, since a conventionally known transmission-type liquid crystal panel can be used as the display panel, the detailed description thereof is omitted. Examples of the liquid crystal panel 16 that can be the display panel of the present embodiment include a so-called active matrix type in which a switching element is formed in each display pixel and various driving types such as a simple matrix type. Further, examples of the voltage application method include a vertical orientation method of applying a predetermined electric potential between two opposing panels and a horizontal electric field method of applying a voltage in a plane direction of the panel. Both methods are applicable. Further, there is no limitation to an arrangement of display pixels, and both a color display and a monochrome display are possible. Further, needless to say, a pair of polarizing plates (not shown) are disposed on both outer surfaces of the liquid crystal panel 16.

As the backlight 17, a so-called edge light type (also called as a side light type) providing a thinner configuration is adopted. The edge light-type backlight 17 is configured so that, with respect to a light guiding plate (not shown) having a size and a shape corresponding to the image display surface of the liquid crystal panel 16, illumination light from LEDs (light-emitting diodes, light sources) (not shown) is incident from a side of the light guiding plate and then is output uniformly toward an image display area of the liquid crystal panel 16. Note here that since the backlight 17 also is not limited to the edge light type and it is possible to adopt currently known various kinds of configurations, the detail description thereof is omitted. Further, other than the LEDs described above, various kinds of light sources such as cold cathode fluorescent tubes or hot cathode fluorescent tubes can be used as the light sources of the backlight 17.

The module structure 18, for example, basically is a bottomed and frame-shaped constituent member made of aluminum and is formed so as to wrap around the whole of the liquid crystal panel 16 and the backlight 17 containing LEDs (light sources). Note here that the module structure 18 that is used in the panel module 4 of the present embodiment is formed with a plurality of openings (not shown) on its bottom surface, for the purpose of reducing the weight of the display device. Further, as the module structure 18, other than the metal materials such as aluminum described above, various kinds of resin materials also can be used.

Inside a metallic outer frame part of the display portion 1 that is formed of the front housing 11 and the back housing 12, the conductive cloth 24 is arranged so as to continuously cover a circumferential edge portion of the panel module 4 on the display surface side, a side surface portion thereof, and a circumferential edge portion thereof on the back surface side.

The conductive cloth 24 may be a cloth in which metal fibers and carbon fibers are woven for providing conductivity. Further, for providing favorable adhesiveness between the front housing 11, the back housing 12 and the panel module 4, an adhesive may be applied to a part of one or both surfaces of the conductive cloth 24 that comes into contact with other members.

In the display portion 1 of the notebook computer 100 of the present embodiment, the elastic member 21 is provided between the conductive cloth 24 and a non-display area of the liquid crystal panel 16 that is the circumferential edge portion of the panel module 4 on the display surface side, the elastic member 22 is provided between the conductive cloth 24 and an outer portion of the module structure 18 that corresponds to a boundary between the liquid crystal panel 16 and the backlight 17 (the side surface portion of the panel module 4), and the elastic member 23 is provided between the conductive cloth 24 and the circumferential edge portion of the module structure 18 on the back surface side that corresponds to the circumferential edge portion of the panel module 4 on the back surface side. Thus, by disposing the elastic members 21, 22 and 23 respectively on the front, the side and the back surface portions of the panel module 4, it is possible to sandwich the panel module 4 firmly with the front housing 11 and the back housing 12.

As the elastic members 21, 22 and 23 used in the notebook computer 100 of the present embodiment, for example, it is possible to use resin and a rubber material such as an elastomer having a thickness of about 1-5 mm.

Note here that although in the notebook computer 100 of the present embodiment, the elastic members 21, 22 and 23 are disposed between the conductive cloth 24 and the panel module 4, the arrangement position of the elastic members are not limited hereto. After an outer surface of the panel module 4 is wrapped tightly by the conductive cloth 24, the elastic members may be disposed between the conductive cloth 24, and the front housing 11 and the back housing 12. Further, by forming the conductive cloth 24 from a member having a predetermined thickness, elasticity and conductivity such as an elastomer and a gasket, the conductive cloth 24 itself can have cushioning properties. Thus, it is possible to hold the panel module 4 firmly with the front housing 11 and the back housing 12.

The antenna module 15 is a module in which antennas formed as wiring patterns, etc., and peripheral circuit components connected to the antennas such as a noise filter are mounted on a circuit board. Note here that although in FIG. 2, only one circuit board is illustrated as the antenna module 15, it is not necessary that the antenna module 15 in the notebook computer 100 of the present embodiment is formed physically on one circuit board. When antennas and peripheral circuits are mounted on different circuit boards, two or more constituent components may be provided as the antenna modules.

In the case where the antenna module 15 is disposed in close proximity to the metallic front housing 11 and back housing 12 having high capacities, the module cannot obtain sufficient antenna properties due to the influence of the metallic housings. To cope with this, in the notebook computer 100 of the present embodiment, the antenna module 15 is contained in the resin-formed front cover 13 and back cover 14 and is disposed so as to be spaced at a predetermined distance from the side edge portion of the metallic portion of the display portion 1 where the front housing 11 and the back housing 12 are joined with each other.

In the notebook computer of the present embodiment, since the conductive cloth 24 is in contact with the metallic front housing 11 and back housing 12, they can have the same electric potential by an electrical connection. Thereby, in the part where the conductive cloth 24 is disposed, undesired electromagnetic radiation produced by the display panel itself or the driving circuit of the panel module 4 can be shielded reliably. Thus, with respect to the antenna module 15 that is disposed to be spaced at a predetermined distance from the side edge portion of the joint portion between the front housing 11 and the back housing 12, it is possible effectively to prevent the decrease in the antenna properties due to the influence of undesired electromagnetic radiation from the panel module 4.

Further, in the notebook computer 100 of the present embodiment, an end portion of the conductive cloth 24 also is in contact with the metallic module structure 18 of the panel module 4. Thus, the whole back surface of the panel module 4 can have the same electric potential as the front housing 11 and back housing 12, whereby the undesired electromagnetic radiation from the panel module 4 can be shielded more steadily.

Note here that in the notebook computer 100 of the present embodiment, in order to shield the undesired electromagnetic radiation from the panel module 4, the conductive cloth 24 is disposed in such a manner as to extend not only to the portion where the antenna module 15 is disposed outside but also along total lengths of three sides of the panel module 4 (the left and right side surfaces and upper surface). Thus, it is possible to protect various electric circuits that are disposed on the periphery of the display portion 1 and that perform functions other than the functions of the notebook computer 100 from the influence of the undesired electromagnetic radiation. It also is possible to prevent the electromagnetic radiation toward the outside of the notebook computer 100. Thereby, the adverse influence on a user using the notebook computer 100 and other electronic equipment disposed on the periphery thereof can be prevented effectively.

In the above, as the embodiment of the display device disclosed in the present application, the case where the transmission-type liquid crystal panel is provided as the display panel and the display device is used as the display portion of the notebook computer has been described. However, the above embodiment is shown merely for an illustrative purpose and is not limiting the objects to which the display device of the present application can be applied.

For example, the display panel used in the display device is not limited to the transmission-type liquid crystal panel, and various kinds of display panels such as a semi-transmission-type and a reflection-type liquid crystal panels, a PDP panel, a EL panel and a FED panel can be used. Note here that in the case of using the reflection-type liquid crystal panel or a so-called light-emitting display device, needless to say, a backlight device is not required as a panel module. Thus, when the backlight is not included in the panel module, the panel module is constituted from a display panel and a circuit board on which a driving circuit for driving the display panel is mounted. Accordingly, the module structure described in the above embodiment may not be provided. In that case, the back surface of the panel module refers to the back surface of the display panel, and on the back surface side of the display surface, the conductive cloth and elastic members will be disposed and attached directly on the back surface of the display panel.

Further, the application purpose of the display device is not limited to the case where it is used as the display portion that serves as the cover section of the notebook computer as shown in the above embodiment. The display device can be used as display portions of various portable equipment such as a PDA, a portable DVD player, an electronic dictionary, a game machine and a mobile telephone. Further, the display device also can be used with stationary-type displays such as a computer display and a television receiver. In the case where electronic equipment is disposed on the periphery of the display device, etc., the display device exhibits the effect of preventing the undesired electromagnetic radiation.

As described above, the display device disclosed in the present application is useful not only as display portions of various portable equipment but also as various displays. Further, the electronic equipment can be used for various application purposes, as equipment in which undesired electromagnetic radiation from the display portion is prevented.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A display device, comprising:
   a panel module that includes a display panel and a driving circuit for driving the display panel, the panel module having a display surface side, a side surface side, and a back surface side;
   a metallic front housing that partially covers the display surface side of the panel module; and
   a metallic back housing that covers the back surface side of the panel module,
   wherein a conductive cloth is disposed between the panel module and the front housing, and between the panel module and the back housing,
   the conductive cloth continuously covers a circumferential edge portion of the panel module on the display surface side, the side surface side of the panel module and a circumferential edge portion of the panel module on the back surface side, and is connected electrically to the front housing and the back housing, and
   one or more elastic members are disposed on the circumferential edge portion of the panel module between the conductive cloth and the display surface side, between the conductive cloth and the side surface side, and between the conductive cloth and the back surface side.

2. The display device according to claim 1,
   wherein a metallic chassis is provided on the back surface side of the panel module, and
   the conductive cloth is connected electrically to the metallic chassis.

3. The display device according to claim 2, further comprising an antenna module spaced from the panel module,
   wherein the conductive cloth is disposed between the antenna module and the panel module.

4. The display device according to claim 1, wherein the conductive cloth comprises metal fibers.

5. The display device according to claim 1, wherein the conductive cloth comprises carbon fibers.

6. Electronic equipment comprising a display device, the display device further comprising:
   a panel module that includes a display panel and a driving circuit for driving the display panel, the panel module having a display surface side, a side surface side, and a back surface side;
   a metallic front housing that partially covers the display surface side of the panel module; and
   a metallic back housing that covers the back surface side of the panel module,
   wherein a conductive cloth is disposed between the panel module and the front housing, and between the panel module and the back housing,
   the conductive cloth continuously covers a circumferential edge portion of the panel module on the display surface side, the side surface side of the panel module and a circumferential edge portion of the panel module on the back surface side, and is connected electrically to the front housing and the back housing, and
   one or more elastic members are disposed on the circumferential edge portion of the panel module between the conductive cloth and the display surface side, between the conductive cloth and the side surface side, and between the conductive cloth and the back surface side.

7. The electronic equipment according to claim 6, wherein the conductive cloth comprises metal fibers.

8. The electronic equipment according to claim 6, wherein the conductive cloth comprises carbon fibers.

* * * * *